United States Patent
Kegel

(10) Patent No.: US 12,008,371 B2
(45) Date of Patent: *Jun. 11, 2024

(54) METHOD AND APPARATUS FOR EFFICIENT PROGRAMMABLE INSTRUCTIONS IN COMPUTER SYSTEMS

(71) Applicant: Advanced Micro Devices, Inc., Santa Clara, CA (US)

(72) Inventor: Andrew G. Kegel, Redmond, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/886,855

(22) Filed: Aug. 12, 2022

(65) Prior Publication Data

US 2022/0382550 A1 Dec. 1, 2022

Related U.S. Application Data

(63) Continuation of application No. 16/451,804, filed on Jun. 25, 2019, now Pat. No. 11,422,812.

(51) Int. Cl.
*G06F 9/30* (2018.01)
*G06F 9/48* (2006.01)
*G06F 30/34* (2020.01)

(52) U.S. Cl.
CPC ...... *G06F 9/30123* (2013.01); *G06F 9/30043* (2013.01); *G06F 9/30079* (2013.01); *G06F 9/4881* (2013.01); *G06F 30/34* (2020.01)

(58) Field of Classification Search
CPC ............. G06F 9/30123; G06F 9/30043; G06F 9/30079; G06F 9/4881; G06F 30/34
See application file for complete search history.

(56) References Cited

U.S. PATENT DOCUMENTS

| 4,481,573 A | 11/1984 | Fukunaga et al. |
| 4,779,188 A | 10/1988 | Gum et al. |

(Continued)

FOREIGN PATENT DOCUMENTS

| TW | 201419140 A | * 5/2014 | ......... G06F 9/30156 |

OTHER PUBLICATIONS

International Search Report and Written Opinion in International Application No. PCT/US2018/035377, dated Sep. 12, 2018, 10 pages.

(Continued)

*Primary Examiner* — Cheng Yuan Tseng
(74) *Attorney, Agent, or Firm* — Kowert, Hood, Munyon, Rankin & Goetzel, P.C.; Rory D. Rankin

(57) ABSTRACT

Systems, apparatuses, and methods for implementing as part of a processor pipeline a reprogrammable execution unit capable of executing specialized instructions are disclosed. A processor includes one or more reprogrammable execution units which can be programmed to execute different types of customized instructions. When the processor loads a program for execution, the processor loads a bitfile associated with the program. The processor programs a reprogrammable execution unit with the bitfile so that the reprogrammable execution unit is capable of executing specialized instructions associated with the program. During execution, a dispatch unit dispatches the specialized instructions to the reprogrammable execution unit for execution. The results of other instructions, such as integer and floating point instructions, are available immediately to instructions executing on the reprogrammable execution unit since the reprogrammable execution unit shares the processor registers with the integer and floating point execution units.

20 Claims, 8 Drawing Sheets

(56) References Cited

U.S. PATENT DOCUMENTS

| | | | |
|---|---|---|---|
| 5,123,101 A | 6/1992 | Sindhu | |
| 5,230,045 A | 7/1993 | Sindhu | |
| 5,493,660 A | 2/1996 | DeLano et al. | |
| 5,574,878 A | 11/1996 | Onodera et al. | |
| 5,640,533 A | 6/1997 | Hays et al. | |
| 5,644,748 A | 7/1997 | Utsunomiya et al. | |
| 5,740,417 A | 4/1998 | Kennedy et al. | |
| 5,748,979 A * | 5/1998 | Trimberger | G06F 9/3885 712/E9.055 |
| 5,897,664 A | 4/1999 | Nesheim et al. | |
| 5,949,423 A | 9/1999 | Olsen | |
| 6,023,564 A | 2/2000 | Trimberger | |
| 6,052,773 A | 4/2000 | DeHon et al. | |
| 6,226,012 B1 | 5/2001 | Priem et al. | |
| 6,239,808 B1 | 5/2001 | Kirk et al. | |
| 6,266,064 B1 | 7/2001 | Snyder | |
| 6,266,753 B1 | 7/2001 | Hicok et al. | |
| 6,510,525 B1 | 1/2003 | Nookala et al. | |
| 6,553,501 B1 | 4/2003 | Yokoe | |
| 6,631,447 B1 | 10/2003 | Morioka et al. | |
| 6,681,239 B1 | 1/2004 | Munroe et al. | |
| 6,681,297 B2 | 1/2004 | Chauvel et al. | |
| 6,751,706 B2 | 6/2004 | Chauvel et al. | |
| 6,801,207 B1 | 10/2004 | Tischler et al. | |
| 6,801,208 B2 | 10/2004 | Keshava et al. | |
| 6,819,321 B1 | 11/2004 | Hsieh et al. | |
| 6,825,848 B1 | 11/2004 | Fu et al. | |
| 6,842,180 B1 | 1/2005 | Maiyuran et al. | |
| 6,891,543 B2 | 5/2005 | Wyatt | |
| 6,895,491 B2 | 5/2005 | Kjos et al. | |
| 6,954,864 B2 | 10/2005 | Schelling | |
| 6,988,214 B1 | 1/2006 | Verdun | |
| 7,023,445 B1 | 4/2006 | Sell | |
| 7,030,877 B1 | 4/2006 | Sell | |
| 7,152,169 B2 | 12/2006 | Cooper et al. | |
| 7,159,766 B2 | 1/2007 | Wurzburg et al. | |
| 7,200,762 B2 | 4/2007 | Pearl | |
| 7,213,125 B2 | 5/2007 | de Dinechi et al. | |
| 7,225,319 B2 | 5/2007 | Campi et al. | |
| 7,383,415 B2 | 6/2008 | Jordan et al. | |
| 7,383,423 B1 | 6/2008 | Hughes et al. | |
| 7,398,371 B2 | 7/2008 | Plondke et al. | |
| 7,401,333 B2 | 7/2008 | Vandeweerd | |
| 7,529,909 B2 * | 5/2009 | Pittman | G06F 9/3822 712/220 |
| 7,716,673 B2 | 5/2010 | Chauvel et al. | |
| 8,028,185 B2 | 9/2011 | Branover et al. | |
| 8,156,284 B2 | 4/2012 | Vorbach et al. | |
| 8,364,933 B2 | 1/2013 | Herrenschmidt et al. | |
| 8,364,946 B2 | 1/2013 | Ishebabi | |
| 8,607,008 B1 | 12/2013 | Glasco et al. | |
| 8,930,674 B2 | 1/2015 | Avudaiyappan et al. | |
| 9,009,451 B2 * | 4/2015 | Murray | G06F 11/3062 712/214 |
| 9,389,915 B2 | 7/2016 | Chang et al. | |
| 9,405,702 B2 | 8/2016 | Mukherjee et al. | |
| 9,471,318 B2 * | 10/2016 | O'Sullivan | G06F 9/38 |
| 9,892,058 B2 | 2/2018 | Wilkes | |
| 11,422,812 B2 | 8/2022 | Kegel | |
| 2004/0025161 A1 | 2/2004 | Chauvel et al. | |
| 2004/0260905 A1 | 12/2004 | Cypher et al. | |
| 2004/0260906 A1 | 12/2004 | Andin et al. | |
| 2006/0026382 A1 | 2/2006 | Hirano et al. | |
| 2006/0294288 A1 | 12/2006 | Seth et al. | |
| 2006/0294341 A1 | 12/2006 | Plondke et al. | |
| 2007/0061547 A1 | 3/2007 | Jordan et al. | |
| 2008/0162868 A1 | 7/2008 | Glew | |
| 2009/0150696 A1 | 6/2009 | Song et al. | |
| 2009/0164814 A1 | 6/2009 | Axford et al. | |
| 2010/0306499 A1 | 12/2010 | Petolino, Jr. | |
| 2011/0208944 A1 | 8/2011 | Champagne et al. | |
| 2013/0346985 A1 | 12/2013 | Nightingale | |
| 2014/0040562 A1 | 2/2014 | Koka et al. | |
| 2014/0101411 A1 | 4/2014 | Sakarda | |
| 2015/0301953 A1 | 10/2015 | Bybell et al. | |
| 2016/0378674 A1 | 12/2016 | Cheng et al. | |
| 2017/0017523 A1 | 1/2017 | Guccione | |
| 2018/0129770 A1 | 5/2018 | Tamir et al. | |
| 2018/0205553 A1 | 7/2018 | Hoppert et al. | |
| 2019/0042313 A1 | 2/2019 | Kegel et al. | |

OTHER PUBLICATIONS

Byma et al., "FPGAs in the Cloud: Booting Virtualized Hardware Accelerators with OpenStack", 2014 IEEE 22nd Annual International Symposium on Field-Programmable Custom Computing Machines, May 11, 2014, pp. 109-116.

Xia et al., "Hypervisor Mechanisms to Manage FPGA Reconfigurable Accelerators", 2016 International Conference on Field-Programmable Technology (FPT), Dec. 7, 2016, pp. 44-52.

Caulfield et al., "A Cloud-Scale Acceleration Architecture", The 49th Annual IEEE/ACM International Symposium on Microarchitecture, Oct. 15, 2016, 13 pages.

Shebanow et al., U.S. Appl. No. 10/676,625, entitled "Caching Compressed Graphics Data for Reduced Power Consumption", filed Oct. 1, 2003, 32 pages.

Pabst, Thomas, "High-Tech and Vertex Juggling—NVIDIAs New GeForce3 GPU", Toms Hardware, Feb. 27, 2001, 39 pages, http://www.tomshardware.com/print/high,reviews-294.html. [Retrieved Jan. 13, 2016].

Berillo, Aleksey, "S3TC and FXT1 Texture Compression", Nov. 30, 2000, IXBT Labs, 17 pages, http://xbtlabs.com/articles/reviews3tcfxt1/. [Retrieved Jan. 13, 2016].

Greene, et al., "Hierarchical Z-Buffer Visibility", 93 Proceedings of the 20th Annual Conference on Computer Graphics and Interactive Techniques, Sep. 1, 1993, 7 pages, ACM, New York, New York, USA.

Parthsarathy, Mohan, "A method for reducing TLB purge overheads associated with context switching between guests in a virtual machine environment", Hewlett-Packard Company, Research Disclosure, Database No. 547039, Nov. 2009, 4 pages, https://rd.orbit.com/rd/search/RD547039.pdf. [Retrieved Mar. 24, 2017].

Lel et al., "Leakage Efficient TLB Design for Embedded Processors", Information Processing Society of Japan, Technical Report, Aug. 4, 2009, 9 pages, vol. 2009-ARC184, No. 13, https://ipsj.ixsq.nii.ac.jp/ej/index.phpaction=pages_view_main active_action= repository_action_common_download item_id=62709 item_no=1 attribute_id=1 file_no=1 page_id=13 block_id=8. [Retrieved on Mar. 24, 2017].

Matoga et al., "Accelerating user-space applications with FPGA cores: profiling and evaluation of the PCIe interface", INESC-ID, 2013, 8 pages.

* cited by examiner

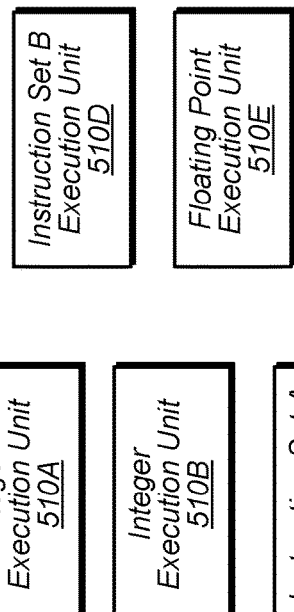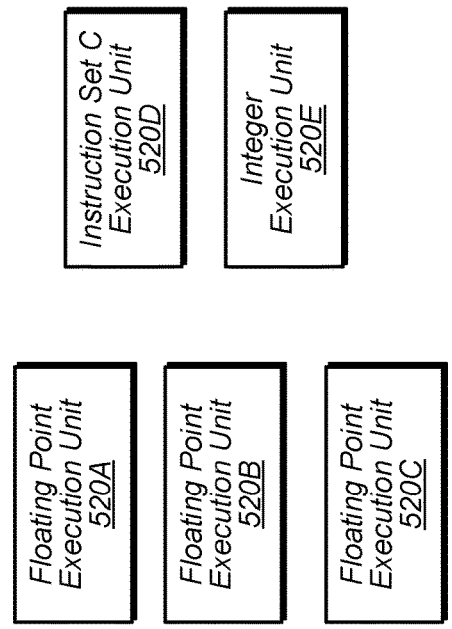
FIG. 5

METHOD AND APPARATUS FOR EFFICIENT PROGRAMMABLE INSTRUCTIONS IN COMPUTER SYSTEMS

CROSS REFERENCE TO RELATED APPLICATIONS

This application is a continuation of U.S. patent application Ser. No. 16/451,804, now U.S. Pat. No. 11,422,812, entitled "METHOD AND APPARATUS FOR EFFICIENT PROGRAMMABLE INSTRUCTIONS IN COMPUTER SYSTEMS", filed Jun. 25, 2019, the entirety of which is incorporated herein by reference.

BACKGROUND

Description of the Related Art

Computing systems often include programmable logic devices on peripheral cards to perform customized computations that are infeasible or would be less efficient if performed by the main processor. One type of a programmable logic device is a field-programmable gate array (FPGA). A field-programmable gate array (FPGA) is an integrated circuit device that is programmable by an end user after the FPGA is installed on a circuit board. In general, an FPGA includes an array of uncommitted circuit elements, which are called logic blocks. These logic blocks are connected together by interconnect resources making up a programmable interconnect fabric. The interconnect resources include logic gates that are inter-wired in multiple, different configurations. The logic blocks in the FPGA are configured to perform complex combinational or logic functions. In some examples, the logic blocks in an FPGA also include memory elements, which are implemented as flip-flops or more complete blocks of memory. In an FPGA, the logic blocks can include elements such as lookup tables (LUTs) and other fixed functions that are programmed by inserting values into small Static Random Access Memories (SRAMs) or registers. The programming of the FPGA is performed before the logic blocks can be used. After programming, each combination of function inputs to an LUT results in a predefined output, allowing the implementation of any logic function.

In a common implementation, a FPGA on a peripheral component interconnect express (PCIe) slot is coupled to a processor via the PCIe bus. Sending computation to the FPGA over the PCIe bus is a long-latency event, with routine accesses to the device going through a device driver and potentially taking hundreds of cycles. When the FPGA is finished with the computation, the FPGA typically generates an interrupt, and handling the interrupt can cause additional delay. Accordingly, more efficient ways of performing computations using programmable logic devices are desired.

BRIEF DESCRIPTION OF THE DRAWINGS

The advantages of the methods and mechanisms described herein may be better understood by referring to the following description in conjunction with the accompanying drawings, in which:

FIG. 5 shows examples of tables used for determining a programmable execution unit configuration for different programs in accordance with one implementation.

DETAILED DESCRIPTION OF IMPLEMENTATIONS

Figure 1:
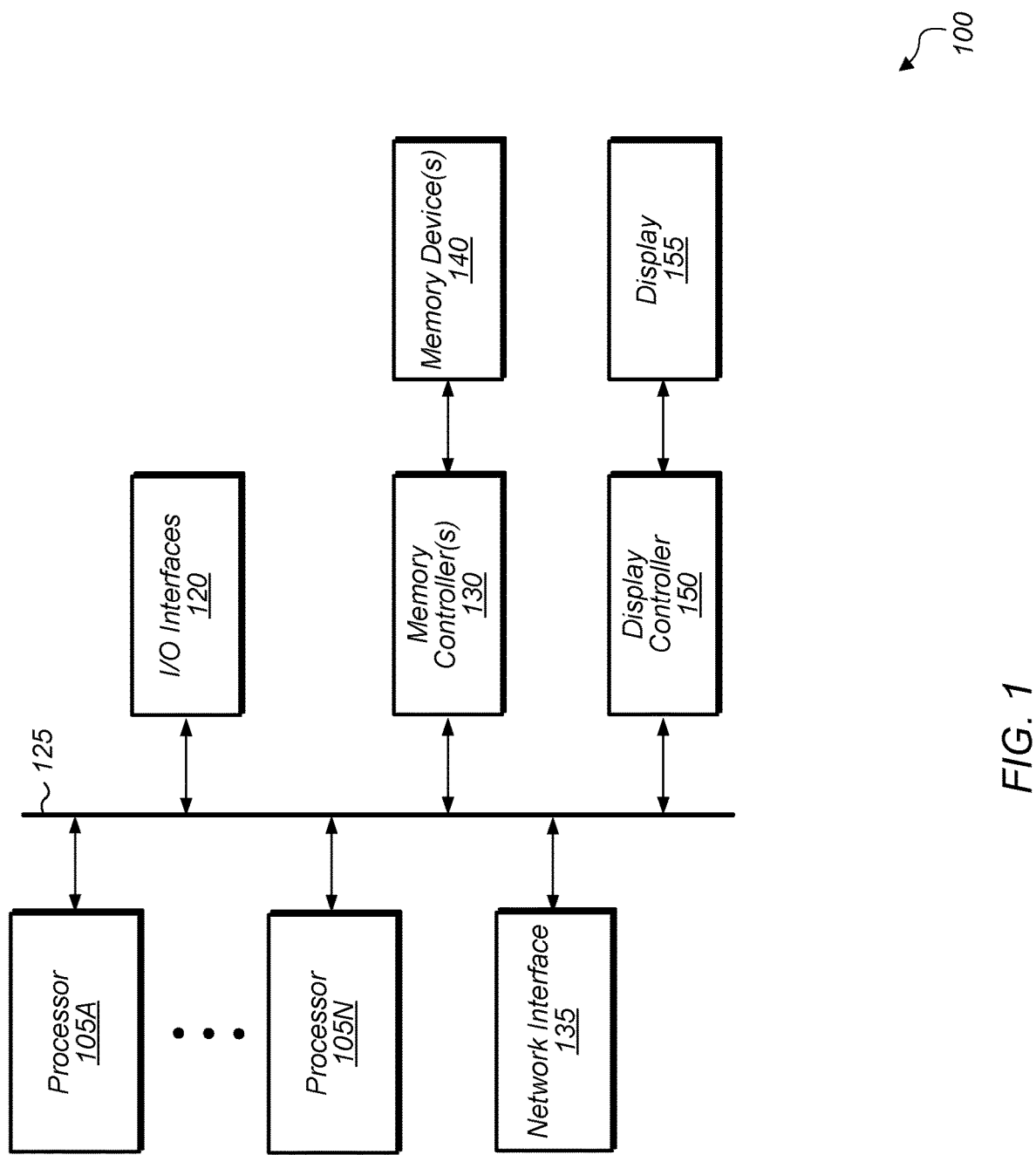
FIG. 1 is a block diagram of one implementation of a computing system.

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Systems, apparatuses, and methods for implementing, as part of a processor pipeline, a reprogrammable execution unit capable of executing specialized instructions are disclosed herein. In one implementation, a processor includes one or more reprogrammable execution units which can be programmed to execute different types of customized instructions. In one implementation, when the processor loads a program for execution, the processor loads a bitfile associated with the program. The processor programs a reprogrammable execution unit with the bitfile so that the reprogrammable execution unit is capable of executing specialized instructions associated with the program. During execution, a dispatch unit dispatches the specialized instructions to the reprogrammable execution unit for execution. The results of other instructions, such as integer and floating point instructions, are available immediately to instructions executing on the reprogrammable execution unit since the reprogrammable execution unit shares the processor registers with the integer and floating point execution units.

In one implementation, each reprogrammable execution unit allows for one or more new instructions to be added to a processor architecture that trigger user-defined operations. These user-defined operations are flexible and completely defined by an application. Additionally, a process containing these new instructions can be run and debugged just like any other process. The reprogrammable execution unit and new instructions can be virtualized in addition to using system security features such as keyed memory and address translation. The reprogrammable execution unit responds to instructions that are decoded and dispatched in the processor pipeline, allowing the reprogrammable execution unit to fit naturally into existing tool chains. Each reprogrammable execution unit performs a variety of operations, just as each integer unit can perform add, subtract, and other operations, and just as each floating point unit can perform add, subtract, multiply, divide, and other operatons. Each reprogrammable execution unit is considered independent and can be programmed differrently from other reprogrammable execution units in the system. Since the reprogrammable execution unit allows for dynamic instructions to be executed, the compilers, debuggers, loaders, and other tool chain components are designed to accommodate these new instructions.

Referring now to FIG. 1, a block diagram of one implementation of a computing system 100 is shown. In one implementation, computing system 100 includes at least processors 105A-N, input/output (I/O) interfaces 120, bus 125, memory controller(s) 130, network interface 135, memory device(s) 140, display controller 150, and display 155. In other implementations, computing system 100 includes other components and/or computing system 100 is arranged differently. Processors 105A-N are representative of any number of processors which are included in system 100.

In one implementation, processor 105A is a general purpose processor, such as a central processing unit (CPU). In one implementation, processor 105N is a data parallel processor with a highly parallel architecture. Data parallel processors include graphics processing units (GPUs), digital signal processors (DSPs), field programmable gate arrays (FPGAs), application specific integrated circuits (ASICs), and so forth. In some implementations, processors 105A-N include multiple data parallel processors. In one implementation, processor 105N is a GPU which provides a plurality of pixels to display controller 150 to be driven to display 155.

Memory controller(s) 130 are representative of any number and type of memory controllers accessible by processors 105A-N and I/O devices (not shown) coupled to I/O interfaces 120. Memory controller(s) 130 are coupled to any number and type of memory devices(s) 140. Memory device(s) 140 are representative of any number and type of memory devices. For example, the type of memory in memory device(s) 140 includes Dynamic Random Access Memory (DRAM), Static Random Access Memory (SRAM), NAND Flash memory, NOR flash memory, Ferroelectric Random Access Memory (FeRAM), or others.

I/O interfaces 120 are representative of any number and type of I/O interfaces (e.g., peripheral component interconnect (PCI) bus, PCI-Extended (PCI-X), PCIE (PCI Express) bus, gigabit Ethernet (GBE) bus, universal serial bus (USB)). Various types of peripheral devices (not shown) are coupled to I/O interfaces 120. Such peripheral devices include (but are not limited to) displays, keyboards, mice, printers, scanners, joysticks or other types of game controllers, media recording devices, external storage devices, network interface cards, and so forth. Network interface 135 is used to receive and send network messages across a network.

In various implementations, computing system 100 is a computer, laptop, mobile device, game console, server, streaming device, wearable device, or any of various other types of computing systems or devices. It is noted that the number of components of computing system 100 varies from implementation to implementation. For example, in other implementations, there are more or fewer of each component than the number shown in FIG. 1. It is also noted that in other implementations, computing system 100 includes other components not shown in FIG. 1. Additionally, in other implementations, computing system 100 is structured in other ways than shown in FIG. 1.

Figure 2:
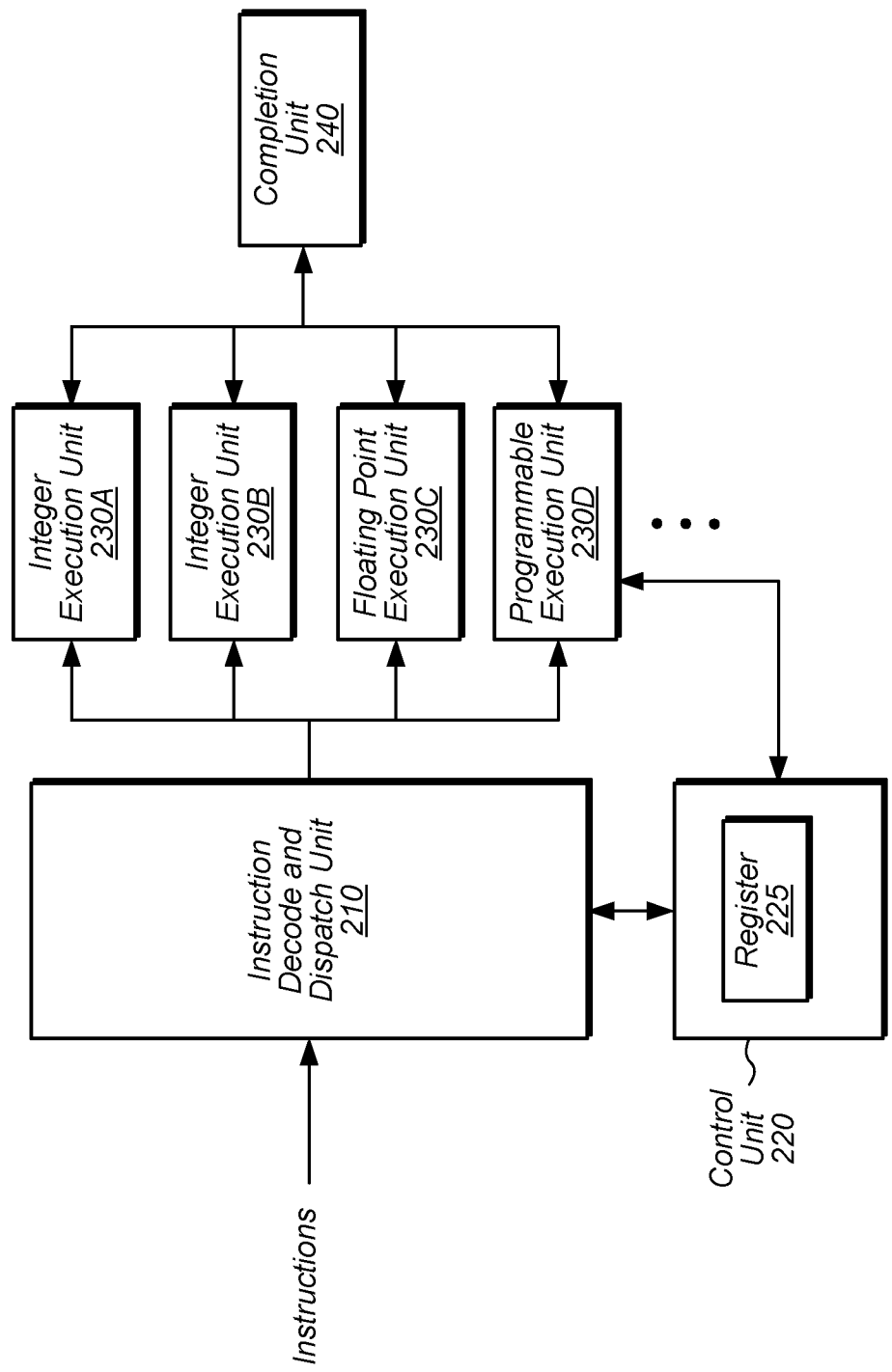
FIG. 2 is a block diagram of one implementation of a processor.

Turning now to FIG. 2, a block diagram of one implementation of a processor 200 is shown. In one implementation, the components of processor 200 are included in one or more of processors 105A-N (of FIG. 1). In one implementation, processor 200 includes at least instruction decode and dispatch unit 210, control unit 220 with control register 225, integer execution units 230A-B, floating point execution unit 230C, programmable execution unit 230D, and completion unit 240. It should be understood that processor 200 also includes any number of other components which are not shown to avoid obscuring the figure. It is noted that completion unit 240 can also be referred to herein as a retirement unit. In other implementations, processor 200 includes other numbers and/or types of execution units.

Instruction decode and dispatch unit 210 receives instructions that have been fetched from memory and/or cache. In one implementation, instruction decode and dispatch unit 210 is connected to an instruction fetch unit (not shown). Although instruction decode and dispatch unit 210 is shown as a single unit, in other implementations, instruction decode and dispatch unit 210 can be split up into separate decode and dispatch units. The instruction decode and dispatch unit 210 assigns registers, reads memory, and performs other tasks on behalf of programmable execution unit 230D, as well as sending operands over to programmable execution unit 230D.

As instructions are decoded into operations, instruction decode and dispatch unit 210 determines to which execution unit to forward an operation based on the type of the operation. For example, integer operations are forwarded to either integer execution unit 230A or integer execution unit 230B. Also, floating point operations are forwarded to floating point execution unit 230C. In one implementation, one or more instructions (e.g., identified by new or repurposed "op codes") are set aside in the instruction set architecture. These instructions are defined to be dispatched to programmable execution unit 230D for execution. Programmable execution unit 230D does not have to be dedicated to a single function or instruction, but rather can respond to multiple different operations. In one implementation, control unit 220 includes a bit indicating if programmable execution unit 230D is active or inactive. If programmable execution unit 230D is active, then instruction decode and dispatch unit 210 can send instructions to programmable execution unit 230D for execution. Otherwise, if the bit indicates the programmable execution unit 230D is not active, an attempt to execute an instruction targeting the programmable execution unit 230D causes an instruction trap.

As the operations complete, completion unit 240 sequences the results into registers and memory (not shown). To allow for high-speed operation, multiple operations are allowed to be in execution at the same time. In one implementation, processor 200 has as an out-of-order microarchitecture. In order to keep the correct order of instructions, completion unit 240 updates registers and memory in the correct order and marks instructions as complete in the correct order. In another implementation, processor 200 has an in-order microarchitecture and executes operations one at a time in sequence.

In one implementation, control register 225 contains the base address for programmable execution unit 230D to control programming of programmable execution unit 230D. In this implementation, the value written to control register 225 serves as a base address which points to a programmable execution unit table in memory. This table contains control and programming information for programmable execution unit 230D. For a processor with multiple programmable execution units, multiple control registers can be implemented, with each control register corresponding to a separate programmable execution unit. In one implementation, processor 200 enables dynamic programming of programmable execution unit 230D via control register 225. In one implementation, the ability to write to the control register 225 requires supervisory permissions, and the contents of the control register 225 are kept secure. In some implementations, the control register 225 is read-only with supervisory permissions. If parts of the control register 225 are protected, it is possible to have an application process that writes its own programming and such an application would be granted read/write permissions to the control register 225.

In one implementation, programmable execution unit 230D is implemented with field programmable gate array (FPGA) elements. These elements include lookup tables (LUTs), programmable gates and logic, memory arrays, and so on. In another implementation, programmable execution unit 230D is implemented as a programmable logic device (PLD). In a further implementation, programmable execution unit 230D is implemented as a programmable logic array. In other implementations, programmable execution unit 230D is implemented using other technologies, elements, or structures.

The software tool stack and software tool chain are also updated to accommodate the new, specialized instructions which are executable by programmable execution unit 230D. The compiler processes source code and generates the specialized instructions where needed. The debugger recognizes and decodes these specialized instructions, allowing single-step debugging to be used. The program loader typically handles code segments, data segments, constant segments, stack segments, and so on. The functionality of the program loader is expanded to include a segment containing the programming information for programmable execution unit 230D. For example, in one implementation, the loader is expanded to support segments compatible with multiple different architectures. In one implementation, when a process is started by the operating system, the various segments of the program are loaded into appropriate parts of memory. In one implementation, the programming information includes different programmable execution unit segments in a single binary. These different segments are optimized for different programmable device architectures that could be included in different processors. The loader would be responsible to load a compatible programmable execution unit segment for the target processor.

In one implementation, the compiler has a suite of bitfiles that it can access. As used herein, the term "bitfile" is defined as a stream of data (i.e., bitstream) that contains configuration data needed for programming a programmable execution unit. The bitfile is typically generated based on a high-level design representation. The high-level design representation can be expressed in a programming language such as Verilog or very high speed integrated circuit hardware description language (VHDL). In one implementation, the high-level design representation is converted into a netlist, and then a compiler and/or synthesis tool generates the bitfile from the netlist. Variations in the way a bitfile is generated are possible and are contemplated. In one implementation, if a flag is passed to the compiler that machine learning will be used, then to accommodate different floating point formats or other operation formats, the compiler searches for bitfiles for these formats and then the programmer can express which formats will be used. The compiler inserts the new instructions where indicated by the programmer inserted directives. Additionally, in another implementation, inline expressions can be used where an assembly language string is inserted and sent to the assembler. Accordingly, in various implementations, an instruction or sequence of instructions can be injected into the code which invokes a specialized instruction or set of instructions to be executed by programmable execution unit 230D.

In one implementation, control unit 220 loads the programming into programmable execution unit 230D. In one implementation, control unit 220 includes a state machine that programs programmable execution unit 230D using a bitfile. The bitfile programming of programmable execution unit 230D occurs at power-up and/or dynamically during run-time. The bitfile is loaded from memory into programmable execution unit 230D. In one implementation, the address of the memory location storing the bitfile and other configuration data is written to control register 225. In one implementation, the writing of the address to control register 225 can be performed by the execution of an instruction in the instruction stream. In another implementation, the updating of the address stored in control register 225 is performed by hardware, firmware, or separate control logic rather than by executing an actual instruction. For example, a separate signal from a different hardware unit could invoke the updating of the address stored in control register 225. When software and/or hardware desires to reprogram programmable execution unit 230D, the delay in physically performing the reprogramming is accommodated for by requesting the reprogramming ahead of time prior when programmable execution unit 230D executes the new, specialized instructions.

In conventional FPGA implementations, reprogramming can take significant time when compared to normal CPU speeds. A millisecond or two to reprogram an FPGA device represents millions of instructions executed by a CPU. To reduce the reprogramming time, in one implementation, an FPGA (or other programmable logic device) contains a plurality of programming sets that can be quickly switched with a simple selection signal. In one example, the LUT blocks would be made twice as large with an added bit to choose which half of the LUT would be active. This means switching from one programming to another for the programmable device would involve changing the state of the added bit.

In one implementation, the specialized instructions that target programmable execution unit 230D are customized floating point formats used in various machine learning algorithms and models. These floating point formats can include other sizes for the mantissa and exponent fields than are found in the traditional FP32 and FP64 formats. Rather than waiting for new silicon to be developed for a new processor, these new formats can be programmed into an existing processor that includes a programmable execution unit 230D. This is an advantage of having a programmable execution unit 230D which can be programmed to handle the new format, as opposed to a fixed execution unit, which would require a new design and new silicon. Waiting for new silicon to become available to handle new formats specialized for machine learning could take months or years. In one implementation, programmable execution unit 230D supports multiple different floating point formats, integer formats, or other types of arithmetic formats, with the number of different types limited only by the number of LUTs, processing elements, and/or gates available in programmable execution unit 230D.

Figure 3:
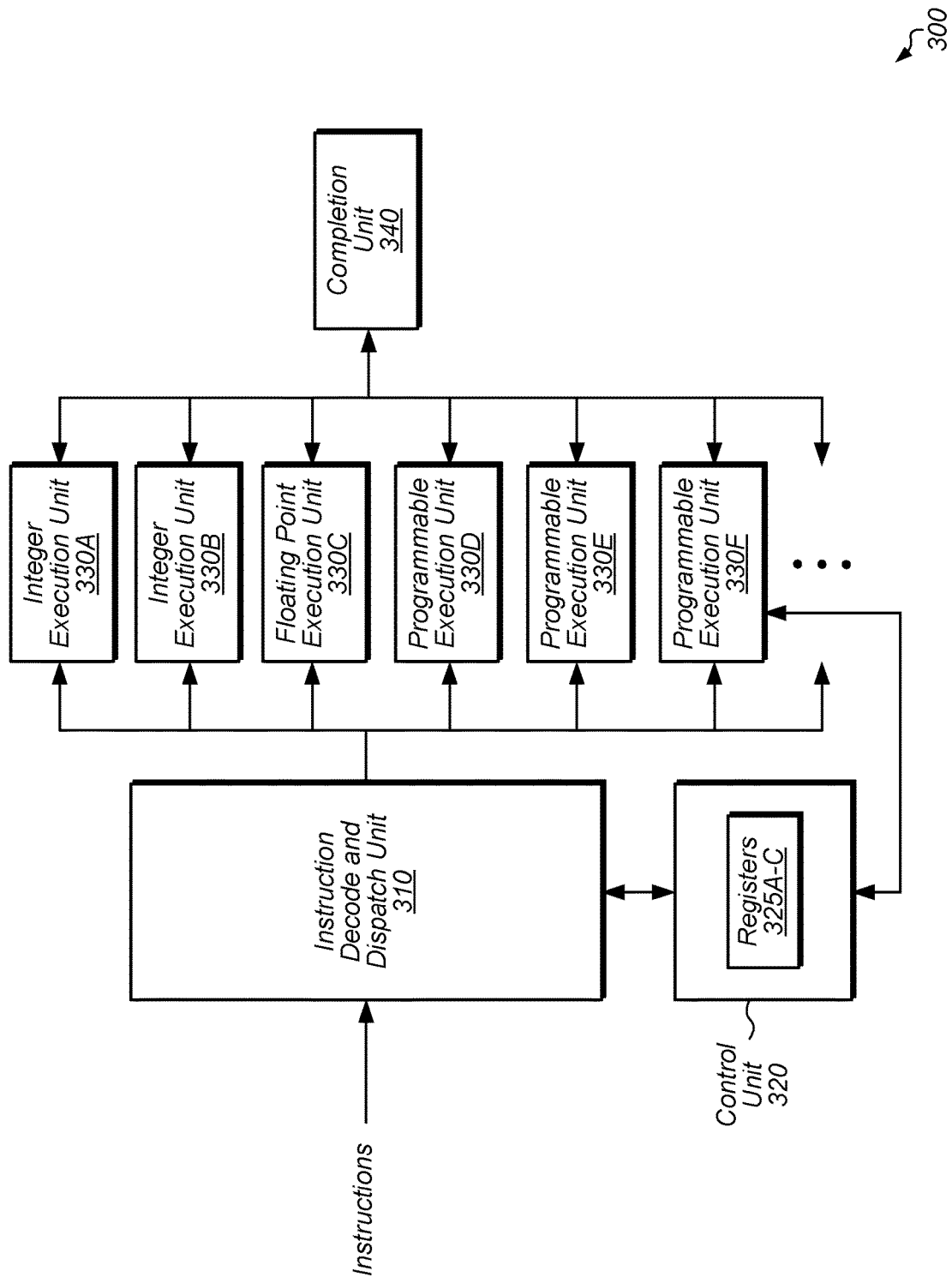
FIG. 3 is a block diagram of one implementation of a processor.

Referring now to FIG. 3, a block diagram of one implementation of a processor 300 is shown. Processor 300 is another example of a processor architecture, with processor 300 including multiple programmable execution units 330D-F rather than just a single programmable execution unit 230D as is shown for processor 200 (of FIG. 2). Programmable execution units 330D-F are representative of any number of programmable execution units, with the number varying according to the implementation. In one implementation, the programming of programmable execution units 330D-F is controlled via control registers 325A-C of control unit 320. In one implementation, there is a separate control register 325A-C for each programmable execution unit 330D-F, respectively. Processor 300 also includes instruction decode and dispatch unit 310, integer execution units 330A-B, floating point execution unit 330C, and completion unit 340. It is noted that processor 300 can also include any number of other components (e.g., cache, memory management unit, fetch unit) which are not shown to avoid obscuring the figure.

In the previous implementation shown for processor 200, it was assumed that all running processes use the same specialized instructions and behavior which map to a single programmable execution unit 230D. However, in the implementation shown for processor 300, a processor pipeline allows for a plurality of programmable execution units 330D-F, and each can be programmed differently to perform different functions in a manner independent of the programming for other programmable execution units. Different specialized instruction codes can be used to access different programmable execution units 330D-F. Alternatively, bits can be added to the process context, such as in one of the control registers, that select which programmable execution units 330D-F to use for the currently running process. Using the processor context with control register values means that different processes can use different programmable execution units 330D-F. In another implementation, the programmable execution units 330D-F are reprogrammed on-the-fly (i.e., during runtime), allowing the specialized instructions to change when the process changes. In one implementation, when the operating system assigns a thread or process to a processor, the operating system ensures that the associated programmable execution unit in the processor is matched to the thread or process.

In one implementation, processor 300 allows an application to program its programmable execution units 330D-F. This allows an application to tune itself to the input data, the computing environment, or other control information not known when the application is compiled. In one implementation, just-in-time (JIT) compiler technology is used to compile the application to target the specific programmable execution units 330D-F available in processor 300. In one implementation, the system or application measures the application performance and generates a bitfile (or another type of programming data) to program one or more of programmable execution units 330D-F to accelerate frequently used operations. Corresponding instructions are then executed by the application.

In one implementation, programmable execution units 330D-F are implemented using an FPGA-like architecture with an internal architecture of LUTs, memory arrays, and logic gates. In another implementation, programmable execution units 330D-F are implemented as a memory array of values, structured as a Boolean truth table. In a further implementation, programmable execution units 330D-F are implemented with multiple different types of internal architecture, and instructions are mapped to the programmable execution unit that is most suited to optimize the corresponding operations. For example, in one implementation, a given specialized instruction operates on 16 bits of a processor register. When this given specialized instruction is executed, the 16 bits of the processor register are applied to the address lines of the programmable execution unit's memory array and the corresponding data contents are read out. In this manner, any Boolean function can be implemented in a small number of cycles. In one implementation, the register contents are a floating point (FP)-16 value and the value produced is the integer representation of the floating point value. In this case, it would take only one cycle and no memory references to do a complex data conversion. Many other examples are possible for applications ranging from machine learning to encryption, all able to be completely defined by the user.

In one implementation, the operating system determines which programmable execution units 330D-F to assign to which application programs. For example, the operating system might want a first program to be able to use a first subset of programmable execution units 330D-F and for a second program to be able to use a second subset of programmable execution units 330D-F. In this example, the first program is prevented from invoking the specialized instructions that are intended for the second program. In one implementation, this is accomplished by having control unit 320 update its mapping of instructions to execution units when a context switch occurs between the first program and the second program. For example, in one implementation, when a given instruction is encountered by dispatch unit 310, dispatch unit 310 dispatches the given instruction to programmable execution unit 330D if a first program is running, while dispatch unit 310 dispatches the given instruction to programmable execution unit 330D if a second program is running.

Figure 4:
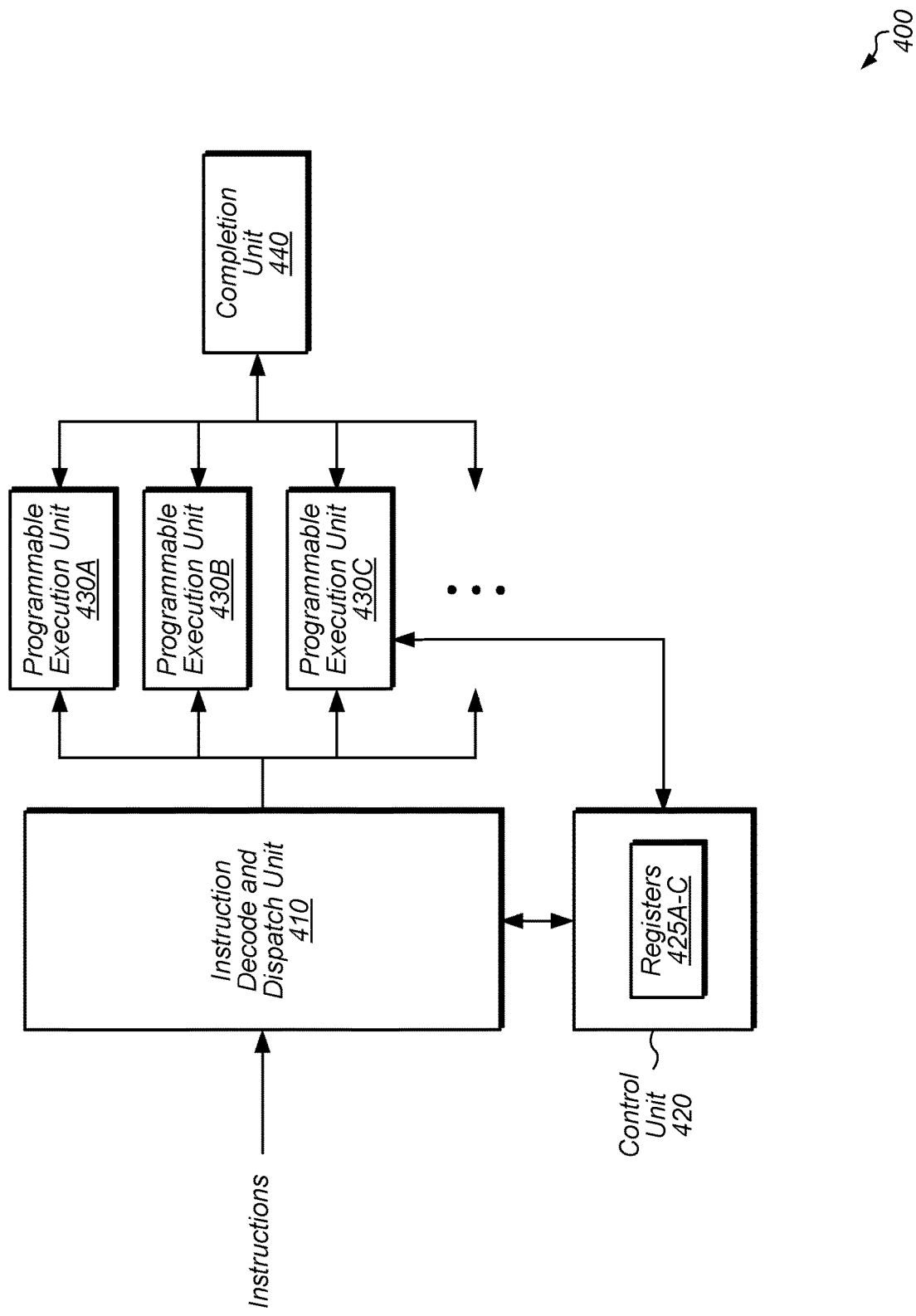
FIG. 4 is a block diagram of one implementation of a processor.

Turning now to FIG. 4, a block diagram of one implementation of a processor 400 is shown. Processor 400 is an example of a processor architecture which only includes programmable execution units 430A-C rather than including fixed-function execution units such as integer execution units, floating point execution units, and so on. However, during use, the programmable execution units 430A-C can be programmed to execute integer operations, floating point operations, and other types of operations that are traditionally executed by hard-wired execution units. For example, in one implementation, programmable execution unit 430A is programmed as an integer execution unit, programmable execution unit 430B is programmed as a floating point execution unit, and programmable execution unit 430C is programmed as a load-store execution unit. Also, one or more other programmable execution units can also be programmed as other types of execution units in other implementations.

While three programmable execution units 430A-C are shown in processor 400, it should be understood that processor 400 can include other numbers of programmable execution units in other implementations. In addition to programmable execution units 430A-C, processor 400 also includes instruction decode and dispatch unit 410, control unit 420 with control registers 425A-C, and completion unit 440. It is noted that processor 400 can also include any number of other components which are not shown to avoid obscuring the figure.

During operation of processor 400, the programming of programmable execution units 430A-C can change during execution of the various software applications. For example, in one implementation, during a context switch from a first program to a second program, one or more of programmable execution units 430A-C can be reprogrammed. For example, if the second program uses one or more specialized instructions that operate on a unique data format, and if the first application does not use these specialized instructions, then one of programmable execution units 430A-C can be reprogrammed to execute these specialized instruction(s). In one implementation, this programmable execution unit 430 is reprogrammed via a write to a corresponding control register 425 of control unit 420. Control logic and/or software determines which control register 425A-C to write based on which programmable execution units 430A-C should be reprogrammed to handle the new specialized instruction(s).

In one implementation, a determination is made on which programmable execution unit 430A-C to reprogram. This determination can be made by the compiler, control unit 420, firmware, software, or some combination thereof. This determination can be based on a variety of factors, with the factors varying according to the implementation. For example, in one implementation, the determination is based on the different types of instructions that are likely to be executed by the second application. For example, if a relatively small number of integer instructions will be executed by the second application, and there are currently two programmable execution units 430A-C that are programmed as integer execution units, then one of these integer execution units is reprogrammed to be the specialized programmable execution unit.

In one implementation, the operating system can assign subsets of programmable execution units to different programs. For example, in one implementation, the operating system assigns the even numbered programmable execution units 430A-C to a first program and the odd numbered programmable execution units 430A-C to a second program when two programs are running on the processor. For other numbers of programs, the operating system can devise other schemes for partitioning the available programmable execution units 430A-C. This partitioning scheme can depend on the number of specialized instructions that each program uses, as well as the latency involved in executing these specialized instructions.

Referring now to FIG. 5, examples of tables used for determining a programmable execution unit configuration for different programs in accordance with one implementation is shown. Table 500A illustrates the expected or observed instruction type percentages for a first program. Each row corresponds to a different type of instruction that would map to a different type of programmable execution unit. The rows corresponding to instructions which have higher percentages of the total number of instructions executed are shown at the top of table 500A, with the percentage decreasing for each row moving down the table.

For example, table 505 corresponds to the instructions used by a first program. For the first program, integers make up 65% of the total instructions executed, instructions from special instruction set A make up 11% of the total instructions executed, instructions from special instruction set B make up 9% of the total instructions executed, other instructions make up 9% of the total instructions executed, and floating point instructions make up 6% of the total instructions executed. It should be understood that this distribution of instructions is merely one example of an instruction distribution.

In one implementation, these percentages listed in table 505 are the expected (i.e., predicted) percentages of total instructions executions based on previously observed implementations of the first program. Special instruction set A and special instruction set B are representative of any type of groups of instructions which do not use the traditional integer or floating point instructions. For example, instruction set A can include a special type of arithmetic instructions. These instructions can be similar to floating point or integer instructions, but with different operand widths, mantissa widths, exponent widths, and so on.

One example of the configuration of how the available programmable execution units are configured for the first program is shown to the right of table 505. In one implementation, it is assumed that there are five programmable execution units 510A-E in the processor. However, this is indicative of one particular implementation. In other implementations, the processor can include other numbers of programmable execution units. For the implementation illustrated to the right of table 505, two of the programmable execution units are programmed as integer execution units 510A-B to handle the relatively high percentage (65%) of integer instructions of the first program. In one implementation, if the expected percentage of a given instruction type is greater than a threshold (e.g., 50%), then more than one programmable execution unit is programmed to execute this given type of instruction. The other instruction types each have one execution unit programmed to execute their specific type of instruction, including instruction set A execution unit 510C, instruction set B execution unit 510D, and floating point execution unit 510E. It is noted that the other instructions can be executed in microcode or alternatively, the other instructions can be sent to a peripheral component for execution since they occur less frequently. Other techniques for handling the other instructions are possible and are contemplated.

Table 515 represents a second program's distribution of instructions. For the second program, floating point instructions make up 62% of the total instructions executed, instructions from special instruction set C make up 17% of the total instructions executed, other instructions make up 11% of the total instructions executed, and integer instructions make up 10% of the total instructions executed. The preferred programmable execution unit 520A-E configuration is shown to the right of table 515 for the execution of the second program. As for the first program, it is assumed that there are five programmable execution units available on the processor executing the second program. This is meant to serve as an example for one implementation. In other implementations, other numbers of programmable execution units are available and potentially one or more fixed execution units (e.g., integer, floating point, load/store) are also available in the processor.

In one implementation, if the expected percentage of a given instruction type is greater than a threshold (e.g., 50%), and if executing this given type of instruction has a relatively long latency, then more than two programmable execution units are programmed to execute this given type of instruction. In this case, since floating point instructions are a relatively high percentage (62%) of the total instructions, and since floating point instructions have a long latency, then three programmable execution units are programmed as floating point execution units 520A-C. The other programmable execution units are programmed as instruction set C execution unit 520D and integer execution unit 520E.

During a context switch from the first program to the second program, some of the execution units are reprogrammed during the context switch. For example, in one implementation, integer execution unit 510A is reprogrammed to be a floating point execution unit, instruction set A execution unit 510C is reprogrammed to be a floating point execution unit, and instruction set B execution unit 510D is reprogrammed to be an instruction set C execution unit. In one implementation, this reprogramming is initiated by writing to three separate control registers. Depending on the implementation, the addresses that store the bitfiles and/or other data used for reprogramming the execution units are written to the control registers.

Figure 6:
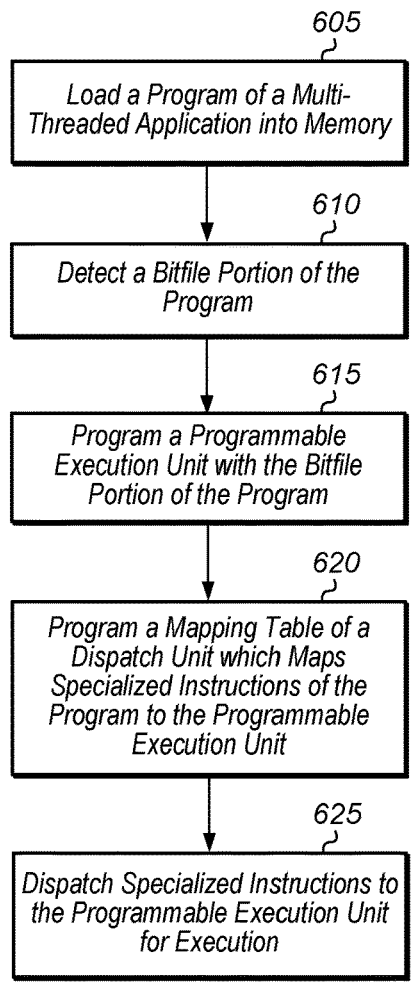
FIG. 6 is a generalized flow diagram illustrating one implementation of a method for executing specialized instructions on a programmable execution unit.
Figure 7:
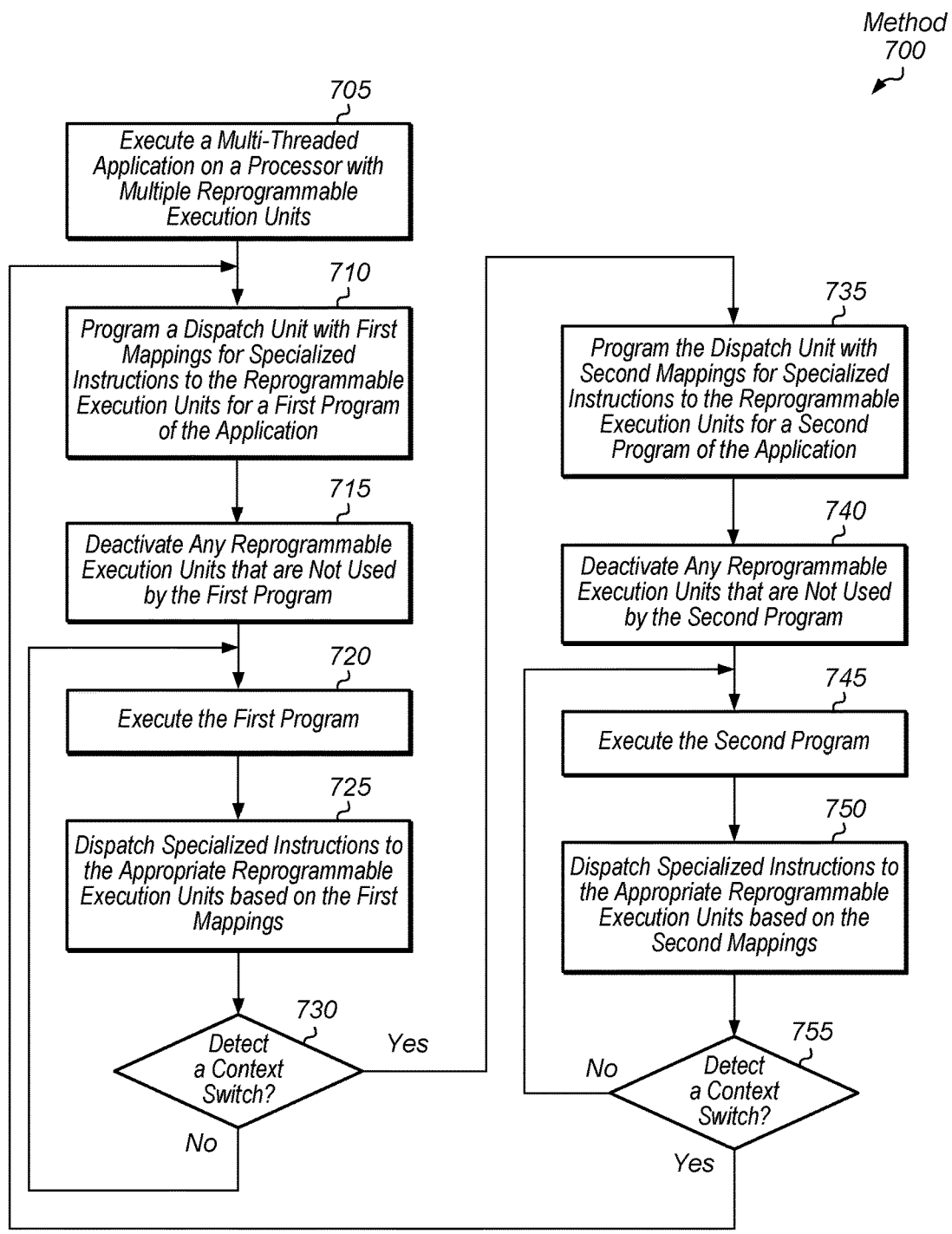
FIG. 7 is a generalized flow diagram illustrating one implementation of a method for using multiple mappings for specialized instructions.

Turning now to FIG. 6, one implementation of a method 600 for executing specialized instructions on a programmable execution unit is shown. For purposes of discussion, the steps in this implementation and those of FIG. 7 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 600.

A processor loads a program of an application into memory (block 605). The processor detects a bitfile portion of the program (block 610). Next, the processor programs a programmable execution unit with the bitfile portion of the program (block 615). Then, the processor also programs a mapping table of a dispatch unit, where the mapping table maps specialized instructions of the program to the programmable execution unit (block 620). As used herein, the term "specialized instruction" is defined as an instruction which is not able to be executed on a fixed-function execution unit (e.g., integer execution unit, floating point execution unit). During execution of the first program, the processor dispatches specialized instructions to the programmable execution unit for execution (block 625). After block 625, method 600 ends.

Referring now to FIG. 7, one implementation of a method for using multiple mappings for specialized instructions is shown. A processor with multiple reprogrammable execution units executes an application (block 705). A dispatch unit is programmed with a first mapping for mapping specialized instructions to the reprogrammable execution units for a first program of the application (block 710). Also, any reprogrammable execution units that are not used by the first program are deactivated (block 715). Next, the processor executes the first program (block 720). During execution of the first program, any specialized instructions are dispatched to the appropriate reprogrammable execution units by a dispatch unit (e.g., instruction decode and dispatch unit 310 of FIG. 3) based on the first mappings (block 725).

If a context switch is detected (conditional block 730, "yes" leg), then the dispatch unit is programmed with a second mapping for mapping specialized instructions to the reprogrammable execution units for a first program of the application (block 735). It is assumed for the purposes of this discussion that the second mapping is different from the first mapping. For example, for at least a first instruction, the first mapping maps the first instruction to a first programmable execution unit for the first program and the second mapping maps the first instruction to a second programmable execution unit for the second program. If a context switch is not detected (conditional block 730, "no" leg), then method returns to block 720 with the processor continuing to execute the first program. After block 735, any reprogrammable execution units that are not used by the second program are deactivated (block 740). Next, the processor executes the second program (block 745). During execution of the second program, any specialized instructions are dispatched to the appropriate reprogrammable execution units by the dispatch unit based on the second mappings (block 750).

If a context switch back to the first program is detected (conditional block 755, "yes" leg), then method 700 returns to block 710 with the control unit programmed with the first mapping. If a context switch back to the first program is not detected (conditional block 755, "no" leg), then method 700 returns to block 745 with the processor continuing to execute the second program. It should be understood that the example of two different programs executing as described in method 700 is intended to illustrate the technique of having separate mappings of specialized instructions to programmable execution units for separate programs. It is noted that other numbers of programs can be executed by the processor, with each program having a separate mapping for dispatching specialized instructions to reprogrammable execution units. In other implementations, method 700 can be implemented with three or more programs, with a separate mapping loaded into the control unit as each different program runs.

Figure 8:
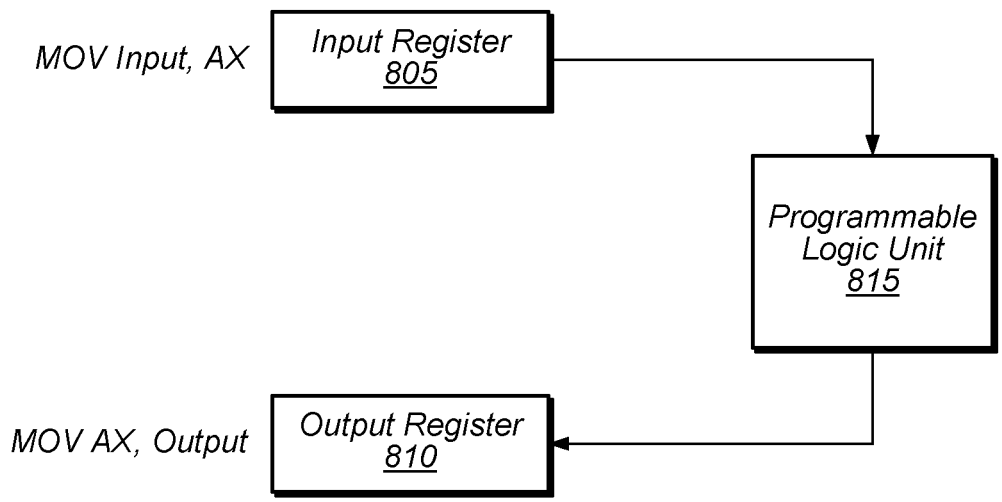
FIG. 8 is a block diagram of one implementation of using special registers with a programmable logic unit.

Turning now to FIG. 8, an alternative embodiment to the above discussed use of special instructions is illustrated. As shown in FIG. 8, an implementation using special registers for a programmable logic unit is shown. In one implementation, two special registers 805 and 810 are defined for a given programmable logic unit 815 within a processor (e.g., processor 200 of FIG. 2). In some implementations, a pair of special registers are defined for each programmable execution unit in the processor. In one implementation, the two special registers are an input register 805 and an output register 810. The registers 805 and 810 can be implemented as "machine-specific" registers or as addressable registers (i.e., memory-mapped 10 (MMIO) registers). In either case, the software can use existing instructions (MOV, RDMSR, WRMSR) to write a value to the input register 805. Triggered by the write operation to the input register 805, the programmable logic unit 815 performs a calculation on the input value and presents the results in the output register 810. Software reads the output register 810 using an existing instruction to obtain the result of the calculation. In the implementation shown in FIG. 8, the "MOV" instruction is used to write and read from registers 805 and 810, respectively, AX (EAX, RAX) is a common x86 register, and "input" and "output" represent the actual memory address of the corresponding registers.

In various implementations, program instructions of a software application are used to implement the methods and/or mechanisms described herein. For example, program instructions executable by a general or special purpose processor are contemplated. In various implementations, such program instructions can be represented by a high level programming language. In other implementations, the program instructions can be compiled from a high level programming language to a binary, intermediate, or other form. Alternatively, program instructions can be written that describe the behavior or design of hardware. Such program instructions can be represented by a high-level programming language, such as C. Alternatively, a hardware design language (Min) such as Verilog can be used. In various implementations, the program instructions are stored on any of a variety of non-transitory computer readable storage mediums. The storage medium is accessible by a computing system during use to provide the program instructions to the computing system for program execution. Generally speaking, such a computing system includes at least one or more memories and one or more processors configured to execute program instructions.

It should be emphasized that the above-described implementations are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A processor comprising:
a dispatch unit comprising circuitry configured to store a first mapping that maps a first type of instruction to a first programmable execution unit and a second type of instruction to a second programmable execution unit; and
wherein the processor comprises circuitry configured to:
program the first programmable execution unit to execute the first type of instruction, responsive to a first program including more than a threshold number of instructions of the first type;
program the second programmable execution unit to execute the second type of instruction;
program the dispatch unit with the first mapping, responsive to detecting execution of a first program; and
program the dispatch unit with a second mapping different from the first mapping.

2. The processor as recited in claim 1, wherein the processor is further configured to deactivate the first programmable execution unit responsive to detecting a context switch to a second program.

3. The processor as recited in claim 1, wherein the processor is further configured to program the first programmable execution unit to execute the first type of instruction, responsive to loading a first program comprising specialized instructions of the first type.

4. The processor as recited in claim 3, wherein the processor is configured to program the first programmable execution unit using a first bitfile associated with the first program.

5. The processor as recited in claim 4, the processor is configured to:
detect an instruction which writes a first address to a first control register; and
write the first address to the first control register, wherein the first address indicates a location in memory storing the first bitfile.

6. The processor as recited in claim 1, wherein the processor is configured to program the dispatch unit with the second mapping different from the first mapping, responsive to detecting at least one of a context switch to a second program or execution of the second program.

7. The processor as recited in claim 6, wherein the threshold number of instructions is based on a comparison of a number of instructions of the first type to executable instructions in the first program.

8. A method comprising:
storing a first mapping that maps a first type of instruction to a first programmable execution unit and a second type of instruction to a second programmable execution unit;
programming the first programmable execution unit to execute the first type of instruction, responsive to a first program including more than a threshold number of instructions of the first type;
programming the second programmable execution unit to execute the second type of instruction;
programming a dispatch unit with the first mapping, responsive to detecting execution of a first program; and
programming the dispatch unit with a second mapping different from the first mapping, responsive to detecting the first program is no longer being executed.

9. The method recited in claim 8, further comprising deactivating the first programmable execution unit responsive to detecting a context switch to a second program.

10. The method as recited in claim 9, further comprising programming the first programmable execution unit to execute the first type of instruction, responsive to loading a first program comprising specialized instructions of the first type.

11. The method as recited in claim 10, further comprising programming the first programmable execution unit using a first bitfile associated with the first program.

12. The method as recited in claim 11, further comprising:
detecting an instruction which writes a first address to a first control register; and
writing the first address to the first control register, wherein the first address indicates a location in memory storing the first bitfile.

13. The method as recited in claim 8, further comprising programming the dispatch unit with the second mapping different from the first mapping, responsive to detecting at least one of a context switch to a second program or execution of the second program.

14. The method as recited in claim 13, wherein the threshold number of instructions is based on a comparison of a number of instructions of the first type to executable instructions in the first program.

15. A system comprising:
a memory configured to store program instructions; and
at least one processor coupled to the memory, wherein a first processor is comprises circuitry configured to:
store a first mapping that maps a first type of instruction to a first programmable execution unit and a second type of instruction to a second programmable execution unit; and
program the first programmable execution unit to execute the first type of instruction, responsive to a first program including more than a threshold number of instructions of the first type;
program the second programmable execution unit to execute the second type of instruction;
program a dispatch unit with the first mapping, responsive to execution of a first program; and
program the dispatch unit with a second mapping different from the first mapping.

16. The system as recited in claim 15, wherein the first processor is further configured to:
detect an instruction which writes a first address to a first control register; and
write the first address to the first control register, wherein the first address indicates a location in the memory storing a first bitfile.

17. The system as recited in claim 16, wherein the first processor is configured to program the first programmable execution unit using the first bitfile.

18. The system as recited in claim 17, wherein the first bitfile is part of a first program.

19. The system as recited in claim 17, wherein the first processor is configured to program the first programmable execution unit using the first bitfile, responsive to loading the first program.

20. The system as recited in claim 19, wherein the first processor is configured to deactivate the first programmable execution unit responsive to detecting a context switch to a second program.

* * * * *

UNITED STATES PATENT AND TRADEMARK OFFICE
CERTIFICATE OF CORRECTION

| | |
|---|---|
| PATENT NO. | : 12,008,371 B2 |
| APPLICATION NO. | : 17/886855 |
| DATED | : June 11, 2024 |
| INVENTOR(S) | : Kegel |

It is certified that error appears in the above-identified patent and that said Letters Patent is hereby corrected as shown below:

In the Claims

Column 14, Claim 15, Line 32, delete "first processor is comprises" and insert -- first processor comprises --.

Signed and Sealed this
Thirteenth Day of August, 2024

Katherine Kelly Vidal
*Director of the United States Patent and Trademark Office*